(12) United States Patent
Wu

(10) Patent No.: US 6,593,830 B2
(45) Date of Patent: Jul. 15, 2003

(54) NON-INTERRUPTIBLE TAP

(75) Inventor: Ming-Tsen Wu, Quarry Bay (HK)

(73) Assignee: Jesmay Electronics Co., Ltd., Tainan (TW)

( * ) Notice: Subject to any disclaimer, the term of this patent is extended or adjusted under 35 U.S.C. 154(b) by 49 days.

(21) Appl. No.: 10/021,240

(22) Filed: Dec. 19, 2001

(65) Prior Publication Data

US 2003/0112093 A1 Jun. 19, 2003

(51) Int. Cl.[7] .................................................. H01P 5/12
(52) U.S. Cl. ....................... 333/100; 333/136; 725/127; 725/149
(58) Field of Search ................................. 333/100, 136, 333/105, 24 R, 101, 127; 439/188, 76.1; 200/50.1, 51 R; 725/127, 149; 455/338–343; 379/93.05, 399.02, 428.01; 348/725

(56) References Cited

U.S. PATENT DOCUMENTS

| | | | | |
|---|---|---|---|---|
| 5,648,745 A | * | 7/1997 | Spriester et al. | 333/100 |
| 5,756,935 A | * | 5/1998 | Balanovsky et al. | 174/52.1 |
| 5,850,165 A | * | 12/1998 | Spriester et al. | 333/100 |
| 5,909,154 A | * | 6/1999 | Brown et al. | 333/100 |
| 6,129,597 A | * | 10/2000 | Gresko | 439/824 |

* cited by examiner

Primary Examiner—Benny Lee
Assistant Examiner—Kimberly Glenn
(74) Attorney, Agent, or Firm—Rosenberg, Klein & Lee (57) ABSTRACT

A non-interruptible tap has a non-interruptible member that is received in a lower part of the main housing and includes a support element, a pair of slide blocks, and a resilient conductive strip. The support element has holes at two ends, mounting on a first, and a second terminals respectively. The slide blocks are movably received in a slot formed between the end holes of the support element. The conductive strip is connected to the slide blocks with two ends sticking out beyond the same. The main housing further has an upper part, to which a circuit board is fitted. When the upper part is not joined to the lower part, e.g. it is removed for maintenance, the conductive strip can stretch to a normal straight shape to contact the first and the second terminals at two ends as to allow signals to be transmitted therethrough to the downstream line. When the upper part is joined to the lower part, sockets on the circuit board will mount on the terminals plus push the slide blocks towards each other, thus making the conductive strip bend and making the ends of the strip disengage from the terminals to prevent the conductive strip from interfering with the transmission of signals.

3 Claims, 7 Drawing Sheets

NON-INTERRUPTIBLE TAP

BACKGROUND OF THE INVENTION

The present invention relates to a tap that splits multi-media signals, and then distributes these split signals to the subscribers' homes as well as the service downstream, and more particularly the present invention relates to a tap, which is equipped with a disengagable connecting member capable of preventing the distribution of the signals to the downstream service from being interrupted when the tap is under maintenance.

Multi-media signals are transmitted to subscriber homes from a headend unit by means of cables, and these multi-media signals are fed to the subscriber homes via a tap, which is provided with a circuit used for filtering, strengthening, and splitting the signals before the signals are transmitted to the downstream service from an output terminal and the subscriber homes from a front panel.

Figure 6:
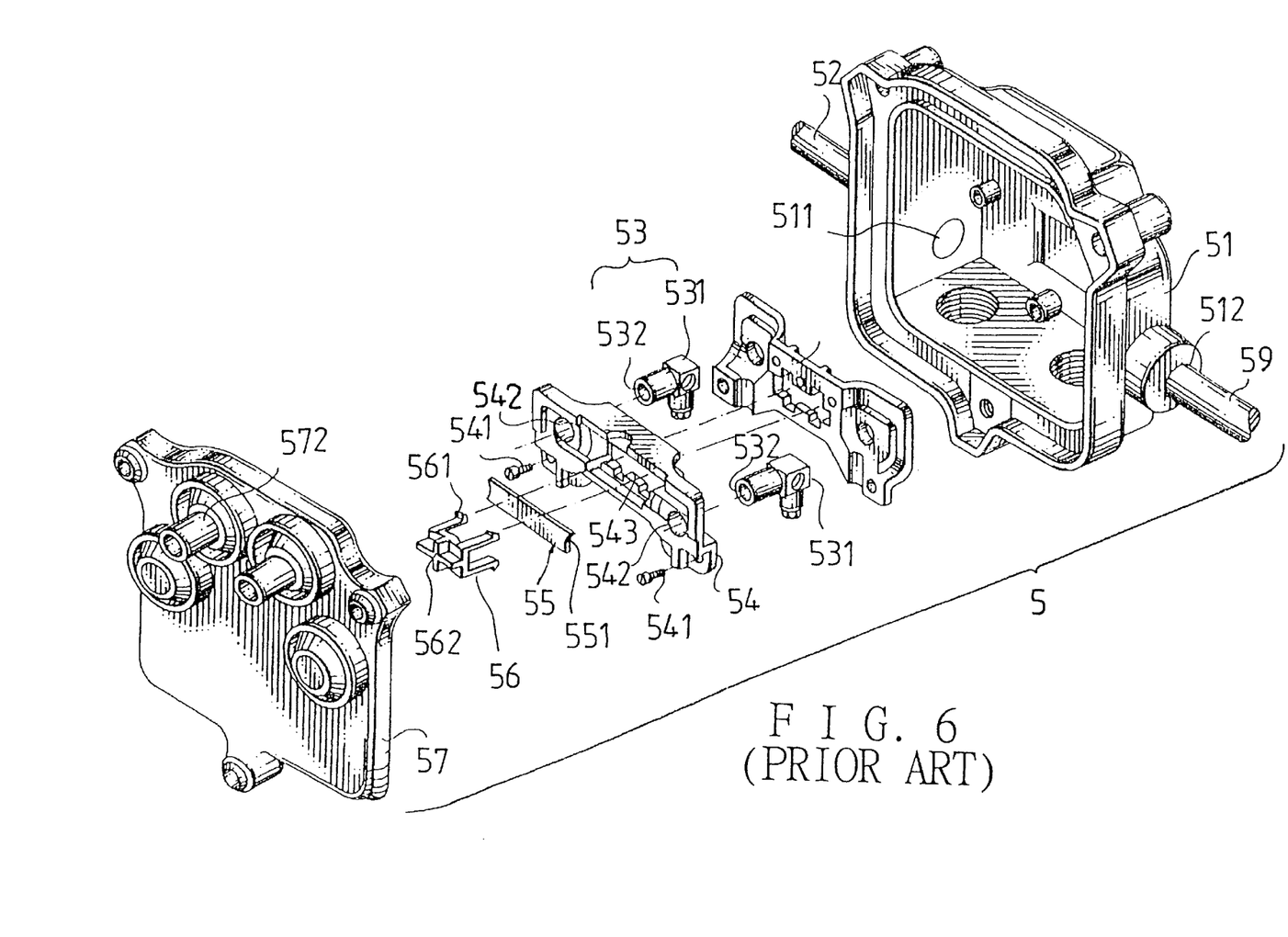
FIG. 6 is an exploded perspective view of the conventional non-interruptible tap in the Background.
Figure 7:
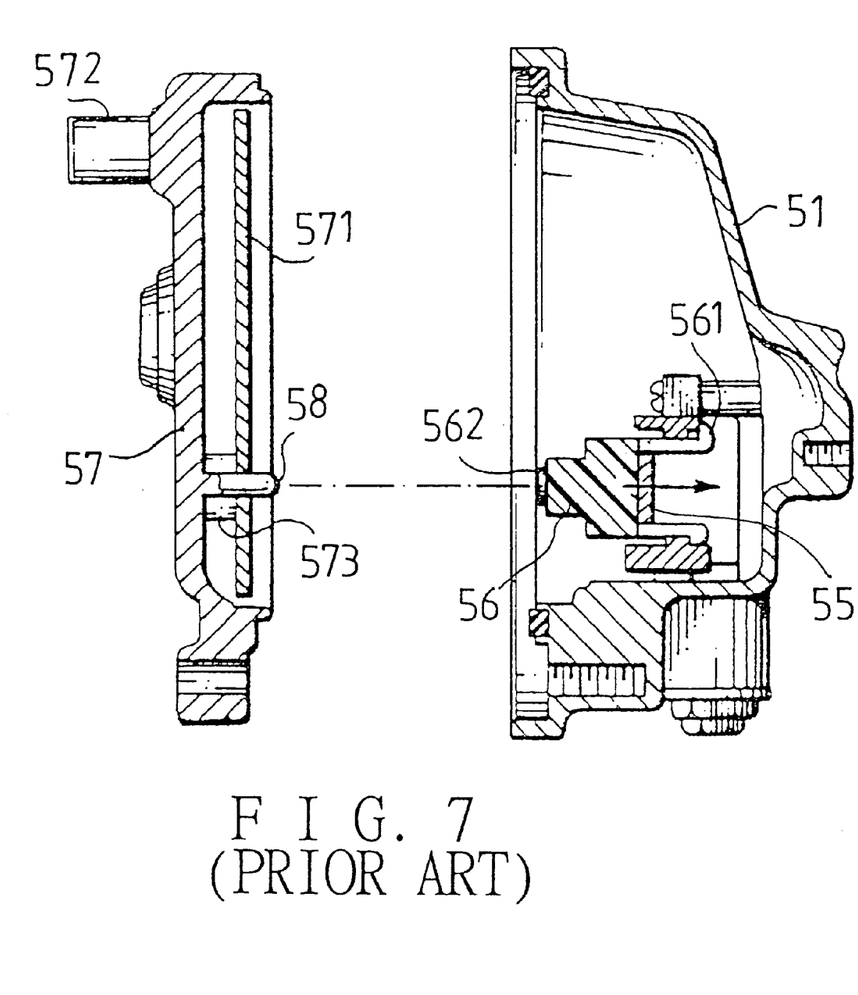
FIG. 7 is a cross-sectional view of the conventional non-interruptible tap in the Background.

Referring to FIGS. 6 and 7, a conventional interruptible tap, disclosed in U.S. Pat. No. 5,648,745, and No. 5,850,165 has a housing member consisting of both a lower part 51 and an upper part 57, a lower terminal support 53, a pair of terminals 531, a top terminal support 54, a disengagable conductive strip 55, a retainer 56, and a circuit 571 (FIG. 7) fitted to the inner side of the upper housing part 57.

An upstream line 52 is passed through an input end 511 of the lower part 51 of the housing member, while a downstream line 59 is passed through an output end 512 of the lower housing part 51. The lower terminal support 53 is secured in the lower housing part 51 with the terminals 531 each being disposed at one end thereof; the terminals 531 each has a plug 532, and are connected to the upstream line 52 the downstream line 59 respectively.

The top terminal support 54 has through holes 542 at two ends, a central through hole 543, and is fixedly connected to the lower terminal support 53 by means of screws 541 with the plugs 532 of the terminals 531 being each passed through one of the through holes 542 thereof, elongated trenches (not numbered) is formed next to the through holes 542. The disengagable conductive strip 55 is resilient, and has two curved ends 551. The disengagable conductive strip 55 is placed on the elongated trenches and the central through hole 543 of the top terminal support 54 with the curved ends 551 each engaging one of the plugs 532 of the terminals 531.

Figure 8:
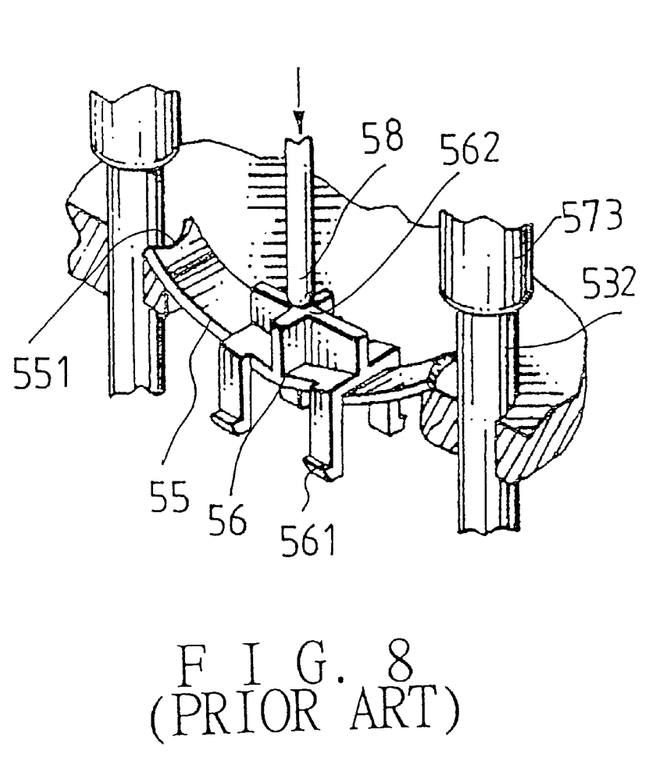
FIG. 8 is a fragmentary view of the conventional tap with the non-interruptible member in the connecting position.
Figure 9:
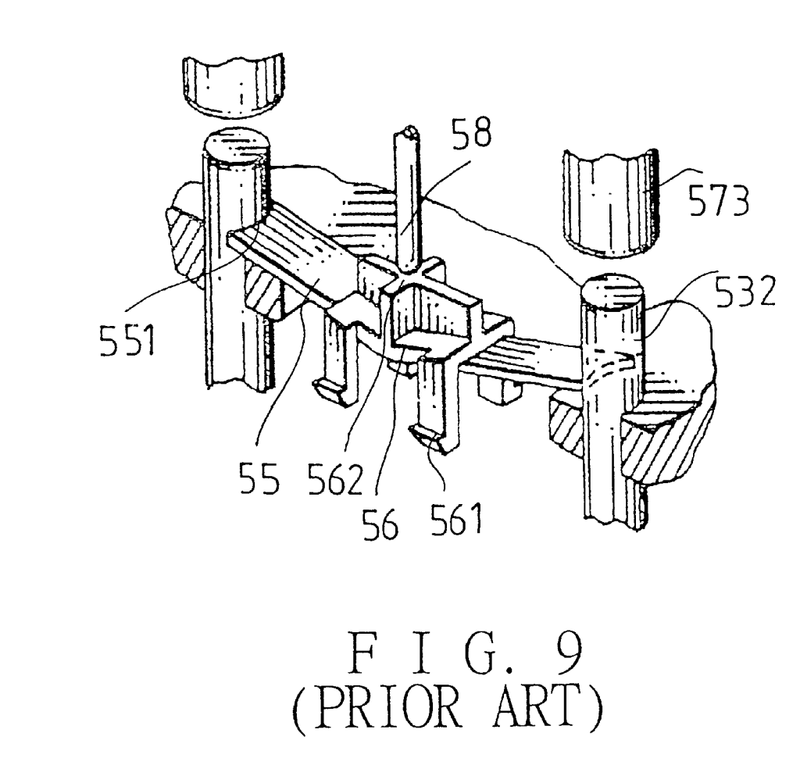
FIG. 9 is a fragmentary view of the conventional tap with the non-interruptible member in the disengaging position.

The retainer 56 has a pushed surface 562 on the upper side, which is the intersection of two crossing substantially rectangular bars, as shown in FIGS. 6, 8 and 9. The retainer 56 further has legs sticking downward which each has an engaging end 561. The retainer 56 is movably connected to the top terminal support 54 with the legs passing through the central through hole 543, and with the bottom part thereof abutting the middle portion of the conductive strip 55; thus, the retainer 56 can't fall off because the engaging ends 561 separably engage the bottom of the top terminal support 54.

The upper part 57 has output terminals 572 at the top surface for connection with lines to the subscribers. Referring to FIG. 7, the upper part 57 further has a circuit 571 fitted to the bottom side, and a pushing protrusion 58 sticking down from the bottom side; two sockets 573 are provided on the circuit 571. The upper part 57 is secured to the lower part 51 by means of screws with the sockets 573 being each mounted on one of the plugs 532, and with the pushing protrusion 58 coming into contact with the pushed surface 562 of the retainer 56 such that the retainer 56 is moved downwardly, and the conductive strip 55 is bent at the middle portion by the retainer 56 for the curved ends 551 to disengage from the respective plugs 532.

Thus, multi-media signals are transmitted to the circuit 571 to be filtered and strengthened from the upstream line 52, the terminal 531 connected to the upstream line 52, and then fed to the subscriber homes via the output terminals 572 of the upper housing pairs 57, and to the downstream service via the other one of the terminals 531 and the downstream line 59; because the conductive strip 55 is not electrically connected to the terminals 531, it will not interfere with the transmission of the signals to the service downstream.

When the upper housing part 57 is removed from the lower part 51 for repair, maintenance or upgrading of the circuit 571, the conductive strip 55 can stretch to the original straight shape so as to contact the plugs 532 at the curved ends 551 again due to the removal of the pushing protrusion 58 from the pushed surface 562 of the retainer 56. Thus, the media-media signals still can be transmitted to the service downstream via the conductive stripe 55 without being interrupted by the maintenance, repair or upgrading of the circuit 571.

However, it is found that the conventional non-interruptible tap has a drawback:

The pushing protrusion 58, and the pushed surface 562 of the retainer 56 have to be foamed with relatively high precision in respect of the position otherwise the pushing protrusion 58 would fail to come into contact with the pushed surface 562, resulting in interference of the conductive strip 55 in the transmission of the multi-media signals to the service downstream. And, the manufacturing cost is increased because the precision in respect of the position of the above mentioned parts is high.

SUMMARY OF THE INVENTION

Therefore, it is a main object of the present invention to provide a non-interruptible tap, of which the upper housing part can make the conductive strip disengage from the plugs effectively and easily when mounted on the lower housing part so as to prevent the conductive strip from interfering with the transmission of the signals to the service downstream.

The non-interruptible tap includes a housing member, a circuit board, and a non-interruptible member including a support element, a pair of slide blocks, and a resilient conductive strip.

The housing member has an upper part, and a lower part, and receives a first, and a second terminals, to which an upstream, and a downstream lines are connected respectively. Several output terminals are provided on the upper part for connection with lines to subscribers. The circuit board is connected to the upper part, and has a pair of sockets, which will mount on the first, and the second terminals when the upper part is joined to the lower part.

The support element is secured in the lower part with two ends being adjacent to the first, and the second terminals. The support element has a lengthwise formed slot, in which the slide blocks are movably received. The conductive strip is connected to the slide blocks with two ends thereof sticking out beyond the same. Thus, when the upper part is not joined to the lower part, the conductive strip can stretch to the original straight shape to engage the first, and the second terminals at two ends so as to allow signals to be transmitted to the downstream line via the same. When the upper part is joined to the lower part, the sockets of the circuit board, when mounted on the first, and the second terminals, will push the slide blocks toward each other, thus making the conductive strip bend at the middle, and disengage from the terminals at two ends. In other words, the conductive strip can be easily move away from the first, and the second terminals so as not to interfere with the transmission of the signals when the upper housing part is joined to the lower housing part.

BRIEF DESCRIPTION OF THE DRAWINGS

The present invention will be better understood by reference to the accompanying drawings, wherein.

DETAILED DESCRIPTION OF THE PREFERRED EMBODIMENT

Figure 1:
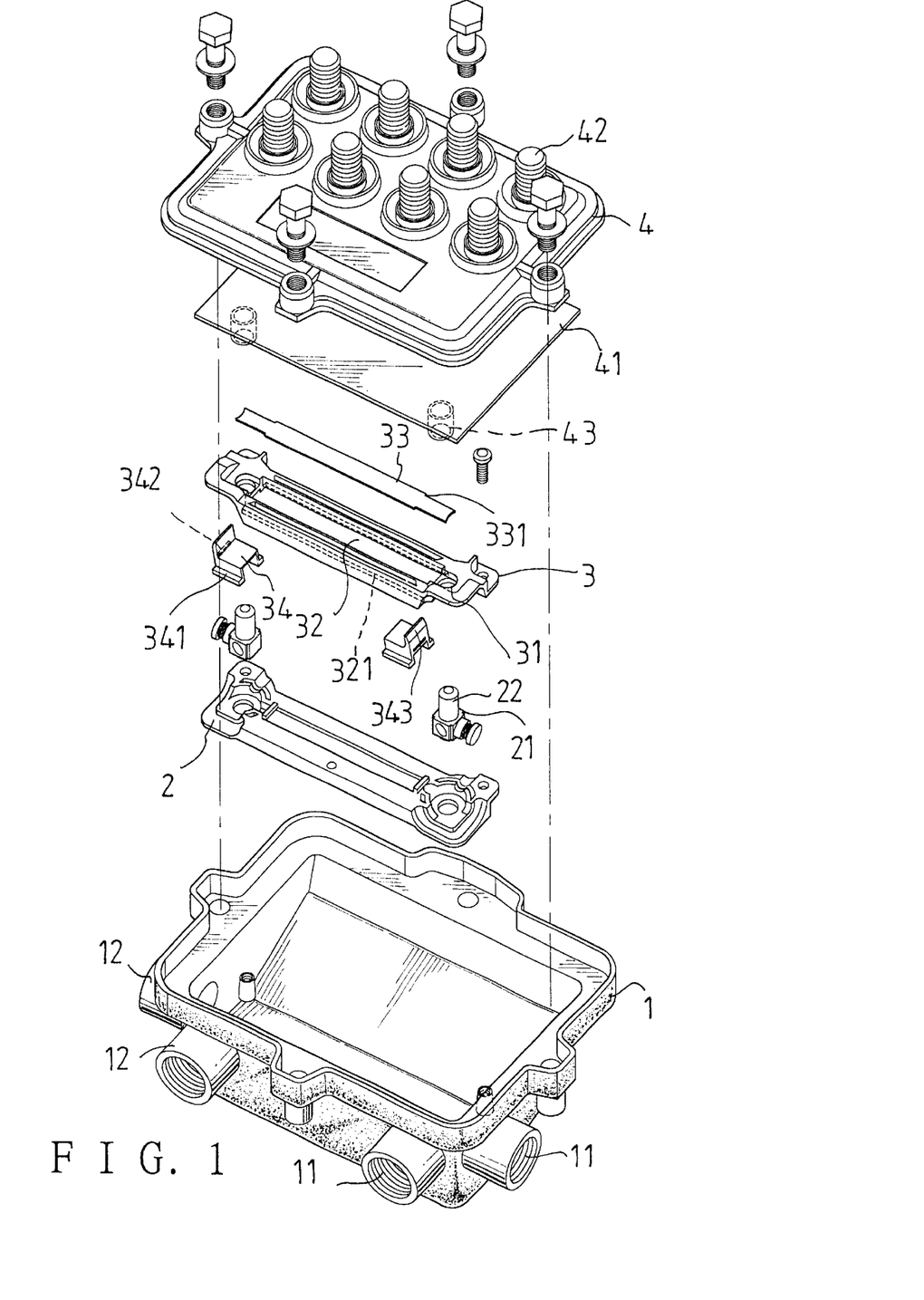
FIG. 1 is an exploded perspective view of the non-interruptible tap according to the present invention.

Referring to FIG. 1, a non-interruptible tap of the present invention includes a housing member consisting of both a lower part 1 and an upper part 4, a circuit board 41, a lower terminal support 2, two terminals 21, and a non-interruptible member including an upper terminal support 3, a conductive strip 33, and two slide blocks 34.

The lower part 1 of the housing member has input ends 11 for connection with upstream lines, and output ends 12 for connection with downstream lines.

The lower terminal support 2 is secured in the lower part 1. The terminals 21 are each placed at one end of the lower terminal support 2, and are connected to the upstream lines and the downstream lines respectively. The terminals 21 each has a plug 22.

Figure 2:
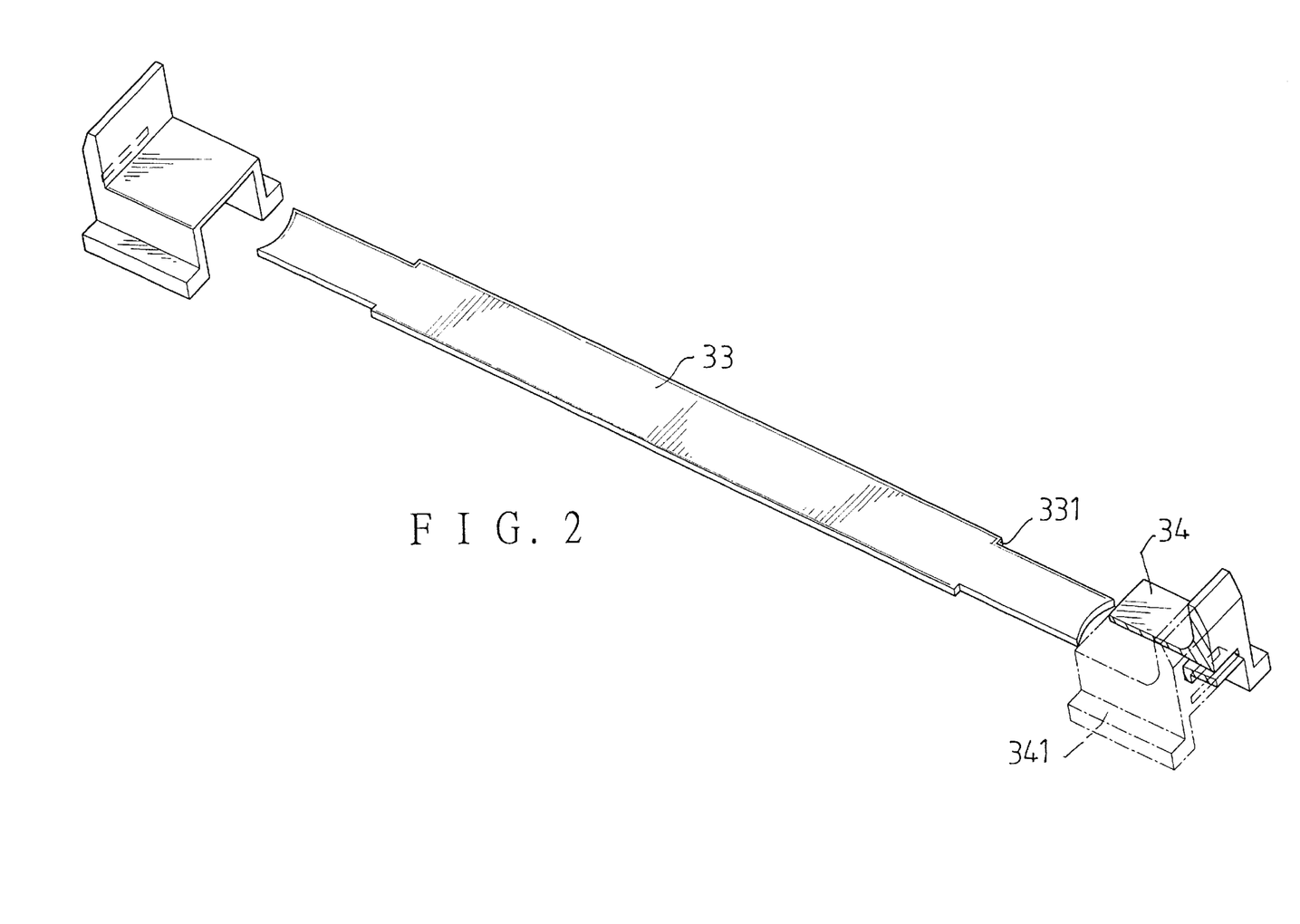
FIG. 2 is a fragmentary exploded perspective view of the non-interruptible tap according to the present invention.
Figure 3:
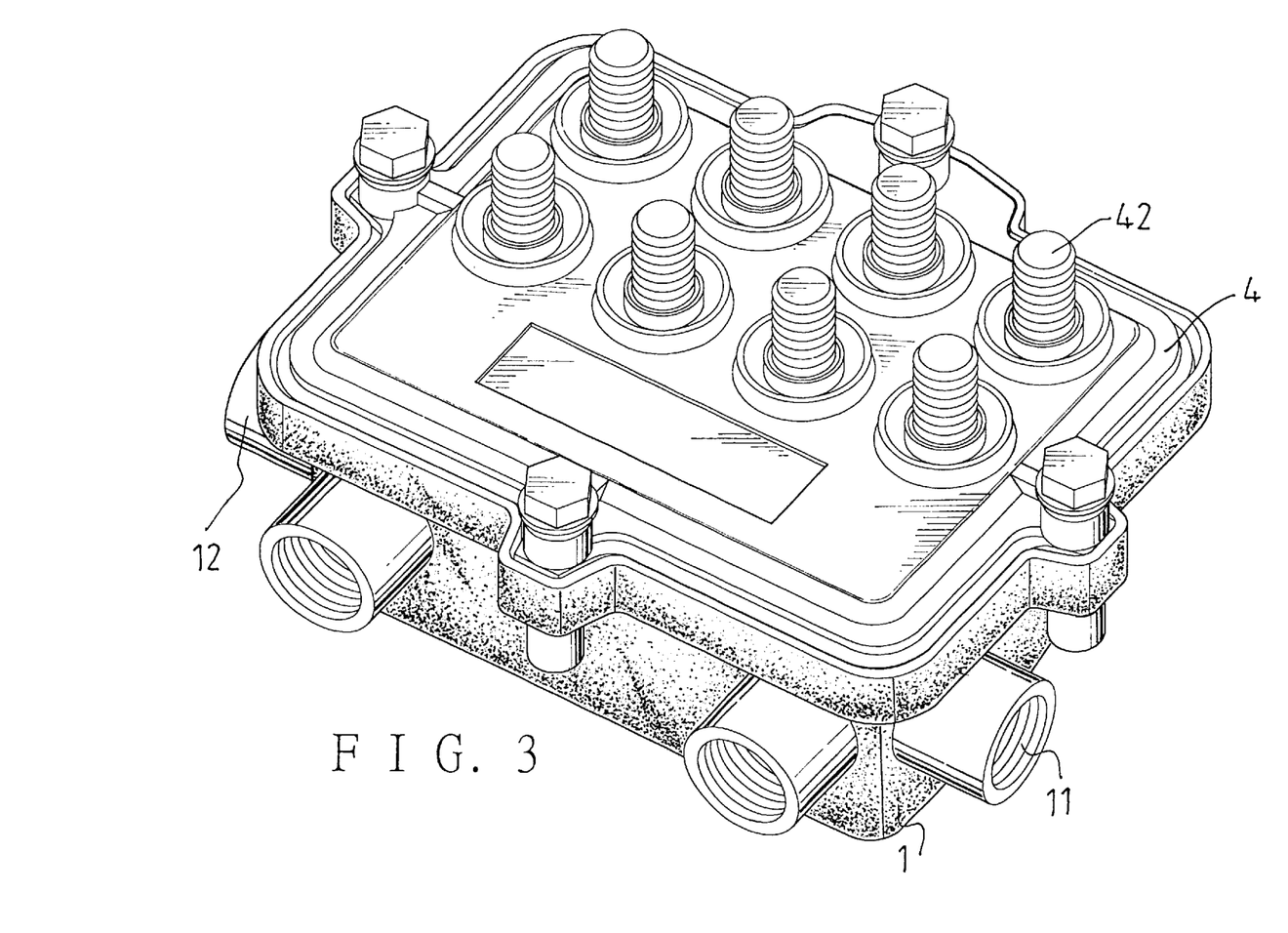
FIG. 3 is a perspective view of the non-interruptible tap according to the present invention.

The upper terminal support 3 has through holes 31 at two ends, a slot 32 between the through holes 31, and guide trenches 321 lengthwise formed on the edges of the slot 32. The upper terminal support 3 is fixedly connected tot he lower terminal support 2 with the plugs 22 of the terminals 21 each passing one of the through holes 331 thereof.

The slide blocks 34 each has two lateral protrusions 341 at the lower part and a connecting hole 342. The slide blocks 34 are slidably received in the slot 32 of the upper terminal support 3 with the lateral protrusions 341 thereof being fitted into the guide trenches 321. The slide blocks 34 are each provided with a sloping part 343 facing outward such that the sockets 43 can easily come into contact with the outward sides of the slide blocks 34 when the circuit board 41 is fitted to the lower part 1 together with the upper part 4.

The conductive strip 33 is resilient, and has two curved ends (not numbered), and engaging portions 331 near the ends that are formed by means of cutting out the lateral edges of the end portions of the strip 33 for the strip 33 to have the end portions narrower than the intermediate portion. The narrower end portions of the conductive strip 33 are passed through the connecting holes 342 of the slide blocks 34 with the curved ends of the strip 33 sticking out from the blocks 34, and with the engaging portions 331 engaging the slide blocks 34 such that the curved ends of the strip 33 come into contact with a respective one of the plugs 22 when the conductive strip 33 stretches to the original straight shape. The connecting holes 342 of slide blocks 34 can also be formed with such a size that the end portions of the conductive strip 33 can be firmly connected thereto without the engaging portions 331.

Figure 5:
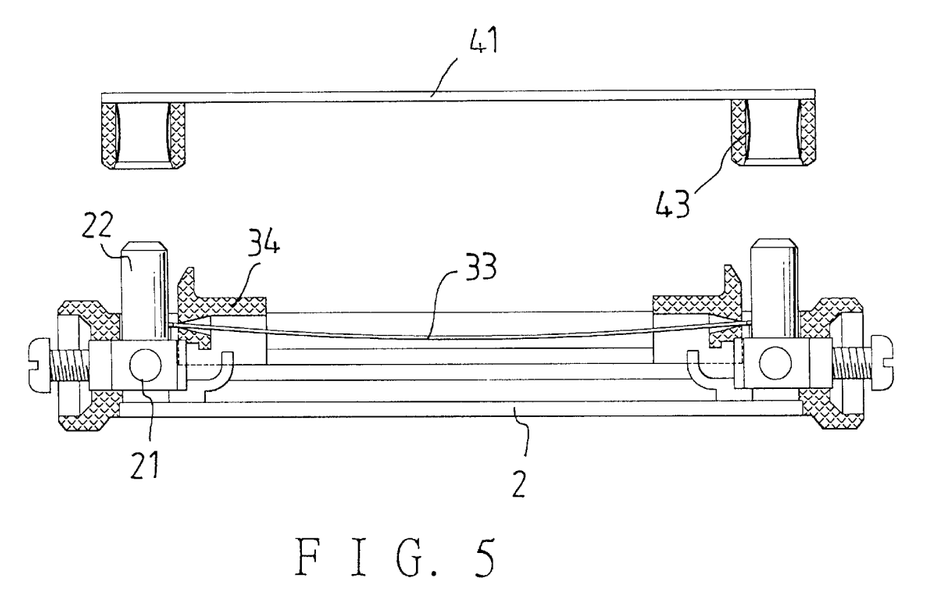
FIG. 5 is a cross-sectional view of the tap of the present invention with the non-interruptible member being moved to the disengaged position.

The circuit board 41 is fitted to the bottom of the upper part 4 of the housing member, and has two sockets 43 on the lower side thereof The upper part 4 has several output terminals 42 on the upper surface thereof for connection with lines (not shown) that used for transmitting signals to the subscribers. The upper part 4 is joined to the lower part 1 by means of bolts with the sockets 43 of the circuit board 41 each mounting onto one of the plugs 22 of the terminals 21; the sockets 43 at the same time come into contact with a respective one of the slide blocks 34 so as to make the slide blocks 34 move towards the middle of the slot 32. Thus, the conductive strip 33 is bent at the middle due to the movement of the slide blocks 34 towards each other, and the curved ends of the stripe 33 disengage from the plugs 22.

Therefore, when the upper housing part 4 is joined to the lower housing part 1, multi-media signals can be transmitted via the upstream lines and the terminal 21 connected with the upstream lines to the circuit board 41 to be filtered and strengthened, and then sent to the subscriber homes via the output terminals 42 and the lines connected thereto plus to the downstream service via the other one of the terminals 21 and the downstream lines. Because the conductive strip 33 disengage from the plugs 22, i.e. it is not electrically connected to the terminals, it can't interfere with the transmission of the signals.

Figure 4:
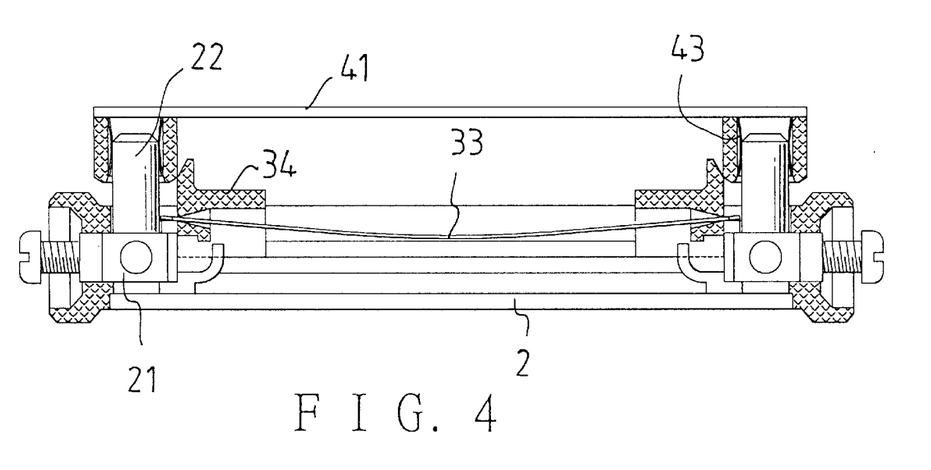
FIG. 4 is a cross-sectional view of the tap of the present invention with the non-interruptible member being moved to the connecting position.

When the upper part 4 is removed of repair, maintenance of the tap; the sockets 43 no longer contact the slide blocks 34; thus, the conductive strip 33 can stretch to the original straight shape to electrically connected the terminals 21 such that the transmission of the multi-media signals to the downstream service via the output ends 12 of the lower housing part 1 is not interrupted.

From the above description, it can be easily seen that the non-interruptible tap of the present invention has the following desirable features:

1. The conductive strip can be easily bent for the ends thereof to disengage from the terminals when the upper housing part is joined to the lower housing part. Therefore, the tap can be made without the high precision needed for the position of the related parts of the conventional tap.

2. The upper part can be relatively easily fitted to the lower part because there is no longer the problem of positioning the pushing protrusion of the upper housing part exactly on the pushed surface of the retainer of the conductive strip in the conventional tap.

What is claimed:

1. A non-interruptible tap, comprising
a housing member having an upper part, a lower part separably joined to said upper part, and a plurality of output terminals on an outer side of said upper part for connection with lines to subscribers; said housing member being connected to upstream, and downstream lines from two ends thereof at first, and second terminals therein respectively; said first and said second terminals each having a plug part;

a circuit board received in said housing member; said circuit board being fitted to an inner side of said upper part of said housing member; said circuit board having two sockets thereon; said sockets being mounted on said plug parts of said first, and said second terminals in said housing member respectively for allowing multi-media signals to be transmitted to subscribers, and service downstream via said output terminals, and said downstream line respectively after same has passed through said circuit board via said first terminal;

said tap being characterized by a non-interruptible member including:

a support element securely positioned in said housing member with said plug parts of said first and said second terminals being secured to two ends thereof; said housing member having a slot lengthwise formed between said ends thereof; said slot being formed with guide trenches on edges thereof;

a pair of slide blocks each having two lateral protrusions, and a connecting hole; said slide blocks being slidable received in said slot of said support element with said lateral protrusions being fitted to said guide trenches; and a resilient conductive strip; said conductive strip being joined to said slide blocks with two end portions sticking out from a respective one of said connecting holes of said slide blocks;

said resilient conductive strip being movable between a disengaged position when said upper part is joined to said lower part for said sockets of said circuit board to mount on said plug parts to come into contact with said slide blocks to force said slide blocks to move toward each other, thus making said conductive strip bend and disengage from said plug parts at the two ends, and an engaged position when said circuit board together with said upper part is removed from said lower part to allow said conductive strip to stretch to a straight shape to come into contact with said plug parts at said ends, thus allowing signals to be transmitted from said upstream line to said downstream line via said first terminal, said conductive strip, and said second terminal without being interrupted by removal of said circuit board.

2. The non-interruptible tap as claimed in claim 1, wherein said connecting holes of said slide blocks are formed with such a size as to prevent said end portions of said conductive strip from moving relative thereto after said end portions are passed therethrough.

3. The non-interruptible tap as claimed in claim 1, wherein said end portions of said conductive strip are cut on lateral edges, and said connecting holes of said slide blocks are formed with such a size as to only allow said cut end portions of said conductive strip to pass through.

* * * * *